United States Patent
Pudleiner et al.

(10) Patent No.: US 11,114,648 B2
(45) Date of Patent: Sep. 7, 2021

(54) UV-PROTECTED COMPONENT FOR OLEDS

(71) Applicants: Covestro Deutschland AG, Leverkusen (DE); OSRAM OLED GmbH, Regensburg (DE)

(72) Inventors: Heinz Pudleiner, Krefeld (DE); Klaus Meyer, Dormagen (DE); Benjamin Krummacher, Regensburg (DE); Simon Schicktanz, Regensburg (DE)

(73) Assignee: Covestro Deutschland AG, Leverkusen (DE)

( * ) Notice: Subject to any disclaimer, the term of this patent is extended or adjusted under 35 U.S.C. 154(b) by 447 days.

(21) Appl. No.: 15/109,030

(22) PCT Filed: Jan. 20, 2015

(86) PCT No.: PCT/EP2015/051002
§ 371 (c)(1),
(2) Date: Jun. 29, 2016

(87) PCT Pub. No.: WO2015/110426
PCT Pub. Date: Jul. 30, 2015

(65) Prior Publication Data
US 2016/0329526 A1 Nov. 10, 2016

(30) Foreign Application Priority Data

Jan. 21, 2014 (EP) .................................. 14152023
Oct. 2, 2014 (EP) .................................. 14187500

(51) Int. Cl.
*H01L 51/52* (2006.01)
*H01L 51/56* (2006.01)

(52) U.S. Cl.
CPC ...... *H01L 51/5284* (2013.01); *H01L 51/5253* (2013.01); *H01L 51/524* (2013.01); *H01L 51/5256* (2013.01); *H01L 51/56* (2013.01)

(58) Field of Classification Search
CPC ............ H01L 51/5284; H01L 51/5253; H01L 51/5256; H01L 51/524; H01L 51/56
See application file for complete search history.

(56) References Cited

U.S. PATENT DOCUMENTS 4,368,240 A  1/1983  Nauta et al.
5,288,778 A  2/1994  Schmitter et al.
(Continued)

FOREIGN PATENT DOCUMENTS

DE  4 238 123 A1  5/1994
DE  197 39 797 A1  3/1998
(Continued)

OTHER PUBLICATIONS

International Search Report for PCT/EP2015/051002 dated Apr. 1, 2015.

*Primary Examiner* — Vongsavanh Sengdara
(74) *Attorney, Agent, or Firm* — Faegre Drinker Biddle & Reath LLP

(57) ABSTRACT

The present invention relates to an organic radiation-emitting component with an active organic layer constituted to generate radiation and one or two radiation-output sides, characterised in that, on at least one radiation-output side of the component, a UV protective film is arranged and connected to the component, wherein the UV protective film contains at least one first layer (A) and a second layer (B), wherein the first layer (A) contains 0.01 to 20% by weight, with reference to the total weight of the first layer (A), of a UV absorber, and wherein the second layer (B) contains polycarbonate. Furthermore, the invention relates to the use of a component according to the invention as an organic light-emitting diode, and for lighting, especially for general lighting.

9 Claims, 3 Drawing Sheets

(56) References Cited

U.S. PATENT DOCUMENTS

| | | | |
|---|---|---|---|
| 5,340,905 A | 8/1994 | Kühling et al. | |
| 6,060,543 A | 5/2000 | Bolle et al. | |
| 6,225,384 B1 | 5/2001 | Renz et al. | |
| 6,255,483 B1 | 7/2001 | Fletcher et al. | |
| 7,166,653 B2 | 1/2007 | Leppard et al. | |
| 9,337,447 B2 | 5/2016 | Krummacher et al. | |
| 2009/0311512 A1* | 12/2009 | Braun | H01L 51/5268 428/323 |
| 2011/0303277 A1 | 12/2011 | Neumann et al. | |
| 2012/0193645 A1* | 8/2012 | Krummacher | H01L 51/5268 257/79 |
| 2012/0227809 A1 | 9/2012 | Bharti et al. | |
| 2014/0233243 A1* | 8/2014 | Cieplik | F21V 3/0625 362/311.02 |
| 2015/0158276 A1* | 6/2015 | Thompson | B32B 17/10678 428/437 |

FOREIGN PATENT DOCUMENTS

| | | |
|---|---|---|
| DE | 102006059129 A1 | 2/2008 |
| DE | 102009025123 A1 | 12/2010 |
| DE | 10 2011079 160 A1 | 1/2013 |
| EP | 0 500 496 A1 | 8/1992 |
| EP | 1308084 A1 | 5/2003 |
| FR | 2812299 A1 | 2/2002 |
| GB | 2333897 A | 8/1999 |
| KR | 10-2012-0052935 A | 5/2012 |
| WO | WO-96/28431 A1 | 9/1996 |
| WO | WO-00/66675 A1 | 11/2000 |
| WO | WO-2005/083813 A2 | 9/2005 |
| WO | WO-2010/086272 A1 | 8/2010 |

* cited by examiner

UV-PROTECTED COMPONENT FOR OLEDS

CROSS-REFERENCE TO RELATED APPLICATIONS

This application is a national stage application (under 35 U.S.C. § 371) of PCT/EP2015/051002, filed Jan. 20, 2015, which claims benefit of European Application Nos. 14152023.9, filed Jan. 21, 2014, and 14187500.5, filed Oct. 2, 2014, all of which are incorporated herein by reference in their entirety.

The present invention relates to an organic radiation-emitting component with an active organic layer constituted to generate radiation and one or two radiation output sides. Furthermore, the invention relates to the use of a component according to the invention as an organic light-emitting diode, and for lighting, especially for general lighting.

BACKGROUND OF THE INVENTION

Especially in the case of OLEDs, ultraviolet radiation can damage the organic layer provided to generate radiation and cause an accelerated failure of the component.

For example, WO2005/083813 describes OLEDs which comprise a UV protective element which contains the inorganic UV absorber. However, if polymers are used as the matrix material, the use of such inorganic UV absorbers leads to turbidities, because the latter are not soluble in the polymer matrix.

Furthermore, a transparent, weather-resistant barrier film which is made from a thin, inorganic-coated film as carrier layer and a further transparent film, is known from WO2010/086272. This barrier film can also fulfill the object of protecting OLEDs from UV radiation. Films made from polyolefins or polyesters are used as carrier layer. The further film is based on polymethylmethacrylate (PMMA) or PMMA-polyolefin co-extrudates. However, such films are not completely clear and transparent and show a slight turbidity.

BRIEF SUMMARY OF THE INVENTION

The object underlying the present invention was therefore to provide a component which comprises a particularly long operating life of the organic layer constituted to generate the radiation and, at the same time, a completely transparent, smooth, glossy and yet scratch-resistant surface.

The present invention relates to an organic radiation-emitting component with an active organic layer constituted to generate radiation and one or two radiation-output sides, characterised in that, on at least one of the radiation-output sides of the component, a UV protective film is arranged and connected to the component, wherein the UV protective film contains at least one first layer (A) and a second layer (B), wherein the first layer (A) contains 0.01 to 20% by weight, with reference to the total weight of the first layer (A), of a UV absorber, and wherein the second layer (B) contains polycarbonate.

It has been surprisingly shown that the films according to the invention are completely transparent and suitable for the manufacture of components which are characterised by a long operating life of the organic layer constituted to generate the radiation. Additionally, the components fitted with the film according to the invention comprise a smooth, glossy and yet scratch-resistant surface.

DETAILED DESCRIPTION OF THE INVENTION

The component according to the invention comprises at least one UV protective film, containing at least one first layer (A) and a second layer (B).

The first layer (A) preferably contains 0.01 to 20% by weight, by particular preference 0.1 to 10% by weight and by quite particular preference 1 to 7.5% by weight of a UV absorber. The UV absorber is preferably an organic UV absorber and selected, for example, from the group of benzotriazole-derivatives, dimeric benzotriazole derivatives, triazine derivatives, dimeric triazine derivatives, diaryl cyanoacrylate or mixtures of the above named compounds. In a preferred embodiment of the invention, the UV absorber is a triazine derivative, by particular preference a triazine of the general formula (I):

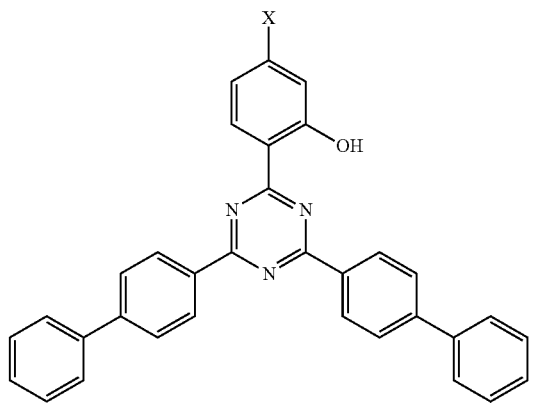

(I)

wherein $X=OR^1$; $OCH_2CH_2OR^1$; $OCH_2CH(OH)CH_2OR^1$ or $OCH(R^2)COOR^3$, in this context, $R^1$ can stand respectively for a branched or unbranched $C_1$-$C_{13}$-alkyl, $C_2$-$C_{20}$-alkenyl, $C_6$-$C_{12}$-aryl or —CO—$C_1$-$C_{18}$-alkyl, $R^2$ can stand for H or a branched or unbranched $C_1$-$C_8$-alkyl, and $R^3$ can stand for $C_1$-$C_{12}$-alkyl; $C_2$-$C_{12}$-alkenyl or $C_5$-$C_6$-cycloalkyl.

In one particularly preferred embodiment of the further layer according to the invention, $X=OR^1$, wherein $R^1$ has the meaning named above, by quite particular preference, $X=OR^1$, wherein $R^1=CH_2CH(CH_2CH_3)C_4H_9$.

Such biphenyl-substituted triazines of the general formula I are known in principle from WO 96/28431; DE 197 39 797; WO 00/66675; U.S. Pat. Nos. 6,225,384; 6,255,483; EP 1 308 084 and FR 2812299. Mixtures of the above named triazine derivatives can also be used.

Since a given minimum extinction of the first layer is necessary for a permanent UV protection, the required UV-absorber concentration also depends upon the layer thickness.

The first layer (A) preferably comprises a layer thickness of $\geq 5$ μm and $\leq 300$ μm, by particular preference $\geq 10$ μm and $\leq 200$ μm and by quite particular preference $\geq 15$ μm and $\leq 100$ μm.

In a further preferred embodiment of the invention, the layer (A) contains a synthetic material permeable for the radiation generated in the active layer, for example, a transparent thermoplastic.

By preference, the first layer (A) contains a transparent thermoplastic selected from: polyacrylates, polymethacrylates, polymethyl methacrylates (PMMA; Plexiglas® manufactured by Röhm), cyclo-olefin-copolymers (COC; Topas® manufactured by Ticona); Zenoex® manufactured by Nippon Zeon or Apel® manufactured by Japan Synthetic Rubber, polysulfones (Ultrason@ manufactured by BASF or Udel® manufactured by Solvay), polyesters, such as PET or PEN, polycarbonate, polycarbonate/polyester-blends, e.g. PC/PET, polycarbonate/polycyclohexyl methanol cyclohexane dicarboxylate (PCCD; Xylecs® manufactured by Sabic IP) and polycarbonate/polybutylene terephthalate (PBT) blends.

By particular preference, the first layer (A) contains polycarbonate, polymethacrylate or polyacrylate, by quite particular preference polymethacrylate. By quite particular preference, the first layer (A) is made from polycarbonate, polymethacrylate or polyacrylate, by quite particular preference polymethacrylate.

In a preferred embodiment of the invention, the first layer (A) contains or is made from a polymethacrylate, by particular preference a polyalkyl methacrylate with alkyl chain lengths below 10 carbon atoms (—$C_nH_{2n+1}$ with n<10) and by quite particular preference polymethyl(meth)acrylate (PMMA, n=1).

Both polymethyl(meth)acrylate (PMMA and also blends of PMMA or of impact-resistant PMMA can be used as polyacrylate. They are available under the brand name Plexiglas® from Röhm GmbH. Polymers of methacrylic acid and their derivatives, for example, their esters, and also polymers of acrylic acid and their derivatives and also mixtures of both of the above named components are understood as polymethly(meth)acrylate.

By preference polymethyl(meth)acrylate synthetic materials with a methylmethacrylate-monomer content of at least 80% by weight, preferably at least 90% by weight and optionally 0% by weight to 20% by weight, preferably 0% by weight to 10% by weight of secondary vinyl copolymerisable monomers such as e.g. $C_1$- to $C_8$alkyl esters of acrylic acid or of methacrylic acid, e.g. methylacrylate, ethylacrylate, butylacrylate, butylmethacrylate, hexylmethacrylate, cyclohexylmethacrylate, further styrene and styrene derivatives, such as, for example, [alpha]-methylstyrene or p-methylstyrene. Second monomers can be acrylic acid, methacrylic acid, anhydrous maleic acid, hydroxy esters of acrylic acid or hydroxy esters of methacrylic acid.

In a further preferred embodiment of the invention, the first layer (A) contains or is made from a polycarbonate. All known polycarbonates are suitable as polycarbonates. These can be homopolycarbonates, copolycarbonates and thermoplastic polyester carbonates.

They preferably have mean molecular weights $\overline{M}_w$ from 18,000 to 40,000, preferably from 22,000 to 36,000 and especially from 24,000 to 33,000, determined by measurement of the relative solution viscosity in dichloromethane or in mixtures of the same volumes by weight of dichlorobenzene calibrated by light scattering.

For the manufacture of polycarbonates, reference should be made, for example, to: "Schnell, Chemistry and Physics of Polycarbonates, Polymer Reviews, Vol. 9, Interscience Publishers, New York, London, Sydney 1964", and to "D. C. PREVORSEK, B. T. DEBONA and Y. KESTEN, Corporate Research Center, Allied Chemical Corporation, Morristown, N.J. 07960, 'Synthesis of Poly(ester)carbonate Copolymers' in Journal of Polymer Science, Polymer Chemistry Edition, Vol. 19, 75-90 (1980)", and to "D. Freitag, U. Grigo, P. R. Müller, N. Nouvertne, BAYER AG, 'Polycarbonates' in Encyclopedia of Polymer Science and Engineering, Vol. 11, Second Edition, 1988, pages 648-718" and finally to "Dres. U. Grigo, K. Kircher and P. R. Müller 'Polycarbonate' in Becker/Braun, Kunststoff-Handbuch, Vol. 3/1, Polycarbonate, Polyacetale, Polyester, Celluloseester, Carl Hanser Verlag München, Vienna 1992, pages 117-299".

The manufacture of the polycarbonates is preferably implemented according to the phase interface method or the melt re-esterification method and will be described in the following by way of example with reference to the phase interface method.

Bisphenols of the general formula

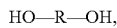

in which R is a divalent organic residue with 6 to 30 carbon atoms which contains one or more aromatic groups, are used by preference as starting compounds.

Examples of such compounds are bisphenols which belong to the group of dihydroxydiphenyls, bis(hydroxyphenyl)alkanes, indane bisphenols, bis(hydroxyphenyl) ether, bis(hydroxyphenyl)sulfones, bis(hydroxyphenyl)ketones and α,α'-bis(hydroxyphenyl)-diisopropylbenzenes.

Particularly preferred bisphenols, which are among the previously named compound groups, are bisphenol-A, tetraalkylbisphenol-A, 4,4-(meta-phenylene diisopropyl) diphenol (bisphenol M), 4,4-(para-phenylene diisopropyl) diphenol, 1,1-bis-(4-hydroxyphenyl)-3,3,5-trimethylcyclohexane (BP-TMC) and optionally mixtures thereof.

Preferably, the bisphenol compounds to be used according to the invention are converted with carbonic acid compounds, especially phosgene, or in the melt re-esterification process with diphenyl carbonates or respectively dimethyl carbonate.

Polyester carbonates are preferably obtained by conversion of the already named bisphenols, at least one aromatic dicarboxylic acid and optionally carbonic acid equivalents. Suitable aromatic dicarboxylic acids are, for example, phthalic acid, terephthalic acid, isophthalic acid, 3,3'- or 4,4'-diphenyl-dicarboxylic acid and benzophenone dicarboxylic acids. One part, up to 80% by weight, preferably from 20 to 50% by weight of the carbonate groups in the polycarbonates can be substituted with aromatic dicarboxylic acid ester groups.

Inert organic solvents used in the phase interface method are, for example, dichloromethane, the various dichloroethanes and chloropropane compounds, tetrachloromethane, trichloromethane, chlorobenzene and chlorotoluene, by preference, chlorobenzene or dichloromethane or respectively mixtures of dichloromethane and chlorobenzene are used.

The phase interface reaction can be accelerated with catalysts such as tertiary amines, especially N-alkylpiperidines or onium salts. Preferably, tributylamine, triethylamine and N-ethylpiperidine are used. In the case of the melt re-esterification process, the catalysts named in DE-A 4 238 123 are preferably used.

The polycarbonates can be branched in a deliberate and controlled manner through the use of small quantities of branching agents. Some suitable branching agents are: phloroglucin, 4,6-dimethyl-2,4,6-tri-(4-hydroxyphenyl)-hepten-2; 4,6-dimethyl-2,4,6-tri-(4-hydroxyphenyl)-heptane; 1,3,5-tri-(4-hydroxyphenyl)-benzene; 1,1,1-tri-(4-hydroxyphenyl)-ethane; tri-(4-hydroxyphenyl)-phenylmethane; 2,2-bis-[4,4-bis-(4-hydroxyphenyl)-cyclohexyl]-propane; 2,4-bis-(4-hydroxyphenyl-isopropyl)-phenol; 2,6-bis-(2-hydroxy-5'-methyl-benzyl)-4-methylphenol; 2-(4-hydroxyphenyl)-2-(2,4-dihydroxyphenyl)-propane; hexa-(4-(4-hydroxyphenyl-isopropyl)-phenyl)-orthoterephthalic acid ester; tetra-(4- hydroxyphenyl)-methane; tetra-(4-(4-hydroxyphenyl-isopropyl)-phenoxy)-methane; α,α,'α"-tris-(4-hydroxyphenyl)-1,3,5-triisopropylbenzene; 2,4-dihydroxybenzoic acid; trimesic acid; cyanuric chloride; 3,3-bis-(3-methyl-4-hydroxyphenyl)-2-oxo-2,3-dihydroindole; 1,4-bis-(4',4"-dihydroxytriphenyl)-methyl)-benzene and especially: 1,1,1-tri-(4-hydroxyphenyl)-ethane and bis-(3-methyl-4-hydroxyphenyl)-2-oxo-2,3-dihydroindole.

The 0.05 to 2 mol. %, with reference to diphenols used, of branching agents or respectively mixtures of the branching agents to be used optionally can be added together with the diphenols but can also be added at a later stage of the synthesis.

Preferably, phenols such as phenol, alkylphenols such as cresol and 4-tert.-butylphenol, chlorophenol, bromophenol, cumylphenol or mixtures thereof are used a chain breakers in quantities from 1-20 mol. %, preferably 2-10 mol. % per mole of bisphenol. Phenol, 4-tert.-butylphenol or respectively cumylphenol are preferred.

Chain breaking agents and branching agents can be added to the syntheses separately or also together with the bisphenol.

The manufacture of the polycarbonates according to the melt re-esterification process is described by way of example in DE-A 4238 123.

Polycarbonates preferred according to the invention for the second layer (B) according to the invention are the homopolycarbonate based on bisphenol A, the homopolycarbonate based on 1,1-bis-(4-hydroxyphenyl)-3,3,5-trimethylcyclohexane and the copolycarbonates based on the two monomers bisphenol A and 1,1-bis-(4-hydroxyphenyl)-3,3,5-trimethylcyclohexane.

The homopolycarbonate based on bisphenol A is particularly preferred.

In a further advantageous embodiment, the roughness of the surface of the first layer (A) ≤2 μm, preferably ≤1 μm. The roughness is determined according to ISO 4288.

The surface of the first layer (A) preferably comprises a gloss level of ≥70. The gloss level is determined according to EN ISO 2813 (angle 60°).

In a special embodiment of the UV protective film according to the invention, the first layer (A) can comprise a coating. The coating is preferably a hard-coat known to the person skilled in the art. By particular preference, the hard-coat is based upon a cross-linked transparent synthetic material. As a result of the coating, the surface of the synthetic material film preferably receives a pencil hardness (determined according to ISO15184) of ≥1H and <8H, and by particular preference of ≥2H and ≤5H. The coating can be applied to the first layer (A) directly without priming. The coating can also contain a UV absorber which corresponds to the preferred embodiments previously named for UV absorbers.

The UV protective film arranged on the component according to the invention also comprises a second layer (B) with the properties described below.

The second layer (B) contains polycarbonate. In this context, the polycarbonate can also be present as polycarbonate/polyester blend, polycarbonate/polycyclohexyl methanocyclohexane dicarboxylate blend or polycarbonate/polybutylene terephthalate blend.

In one particularly preferred embodiment of the invention, the second layer B is made from polycarbonate.

All of the polycarbonates listed for the first layer (A) are suitable polycarbonates. The homopolycarbonate based on bisphenol A is particularly preferred.

The second layer (B) can contain small quantities of a UV absorber. The second layer (B) can contain 0.01 to 0.3% by weight, preferably 0.01 to 0.1% by weight of a UV-absorber. The UV absorber is preferably an organic UV absorber and selected, for example, from the group of benzotriazole-derivatives, dimeric benzotriazole derivatives, triazine derivatives, dimeric triazine derivatives, diaryl cyanocrylates or mixtures of the above named compounds. In a preferred embodiment of the invention, the UV absorber is a triazine derivative. However, in a further embodiment of the invention, the second layer (B) does not contain a UV absorber.

The second layer (B) preferably comprises a layer thickness of ≥30 μm and ≤700 μm, by particular preference ≥50 and ≤500 μm and by quite particular preference ≥140 μm and ≤300 μm.

By preference, the surface of the second layer (B) comprises a gloss level, determined according to EN ISO 2813 (angle 60°), of ≥60, by particular preference ≥90 and by quite particular preference ≥95.

Furthermore, the surface of the second layer (B) preferably comprises a roughness, determined according to ISO 4288 of ≤2 μm, by particular preference ≤1 μm.

In a further embodiment of the invention, the second layer (B) can also comprise a structured and matte surface. In this case, the matte surface is preferably formed by means of the surface of the synthetic-material film facing towards the component. This surface then preferably comprises a gloss level of ≤50 and a roughness of ≥15 μm.

Both the first layer (A), and also the second layer (B) of the films according to the invention can additionally contain additives, such as processing agents. These include especially mould-release agents, flow-promoting agents, stabilisers, especially thermo-stabilisers, anti-static agents and/or optical brighteners. In this context, different additives or respectively different concentrations of additives can be present in each layer. By preference, the first layer (A) contains (contain) the anti-static agents or mould-release agent.

Examples of appropriate anti-static agents are cationically active compounds, for example, quaternary ammonium-, phosphonium- or sulfonium salts, anionically active compounds, such as alkyl sulfonates, alkyl sulfates, alkyl phosphates, carboxylates in the form of alkaline- or earth alkaline metallic salts, non-ionogenic compounds, for example, polyethylene glycol ester, polyethylene glycol ether, fatty acid esters, ethoxylated fatty amines. Preferred anti-static agents our quaternary ammonium compounds, such as dimethyl diisopropyl ammonium perfluorobutane sulfonate.

By preference, appropriate stabilisers are used for polycarbonates. Appropriate stabilisers are, for example, phosphines, phosphites or Si-containing stabilisers and other compounds described in EP-A 0 500 496. Triphenyl phosphites diphenylalkyl phosphites, phenyldialkyl phosphites, tris-(nonylphenyl)phosphite, tetrakis-(2,4-di-tert.-butylphenyl)-4,4'-biphenylen-diphosphonite, bis(2,4-dicumylphenyl)petaerythritol diphosphite and triaryl phosphite may be named by way of example. Triphenylphosphine and tris-(2,4-di-tert.-butylphenyl)phosphite are particularly preferred.

Suitable mould-release agents are, for example, the esters or partial esters of mono- to hexa-valent alcohols, especially of glycerine, pentaerythritol or of guerbet alcohols.

Monovalent alcohols are, for example, stearyl alcohol, palmityl alcohol and guerbet alcohols, a divalent alcohol is, for example, glycol, a trivalent alcohol is, for example, glycerine, tetravalent alcohols are, for example, pentaerythritol and meso-erythritol, pentavalent alcohols are, for example, arabitol, ribitol and xylitol, hexavalent alcohols are, for example, mannitol, glucitol (sorbitol) and dulcitol.

The esters are preferably the monoesters, diesters, triesters, tetraesters, pentaesters and hexaesters or mixtures thereof, especially static mixtures of saturated, aliphatic $C_{10}$ to $C_{36}$-monocarboxylic acids and optionally hydroxy-monocarboxylic acids, preferably with saturated, aliphatic $C_{14}$ to $C_{32}$-monocarboxylic acids and optionally hydroxy-monocarboxylic acids.

The commercially available fatty acid esters, especially pentaerythritol and of glycerine can contain less than 60% different partial esters dependent upon the manufacturer.

Saturated, aliphatic mono-carboxylic acids with 10 to 36 C-atoms are, for example, capric acid, lauric acid, myristic acid, palmitic acid, stearic acid, hydroxystearic acid, arachidic acid, behenic acid, lignoceric acid, cerotic acid and montanic acids.

The UV protective film according to the invention can also contain organic colourings, inorganic colouring pigments, fluorescent colourings, and by particular preference, optical brighteners.

The UV protective film is preferably free from particles or fillers with scattering properties.

The UV protective film is preferably free from regions with scattering properties. This can be desirable, for example, if the film is to be completely clear, for example, in the case of a reflecting OLED, to avoid impairing the reflective property. In this context, especially particles with scattering properties and arbitrary substances with scattering properties and cavities (especially gaseous inclusions) with scattering properties are designated as regions with scattering properties. By particular preference, the UV protective film is free from regions with scattering properties for visible light, that is, light within the visible spectral range from 380 nm to 780 nm.

By preference, a layer surface of the first layer extending on a side facing away from the active organic layer over the entire first layer is free from regularly arranged geometric structural elements. This can be desirable, for example, if the film is to be completely smooth, for example, in the case of a reflecting OLED, to avoid impairing the reflective property. In this context, regularly arranged structural elements are understood to mean that either the structural elements themselves each comprise one or more elements of symmetry (especially planes of symmetry), or that a structure formed by a plurality (that is at least 3 or at least 5 or even at least 10) of structural elements comprises elements of symmetry (for example, parallel displacements).

The previously named flat surface of the first (A) can be parallel to the active organic layer.

By preference, a layer surface of the first layer extending on a side facing away from the active layer over the entire first layer is free from projections on the layer surface and/or indentations in the layer surface with a height or respectively depth of more than 2 µm, by particular preference more than 1 µm. This can be desirable, for example, if the film is to be completely smooth, for example, in the case of a reflecting OLED, to avoid impairing the reflective property. In particular, the layer surface of the first layer extending on a side facing away from the active layer over the entire first layer is free from projections on the layer surface and/or indentations in the layer surface with a height or respectively depth of more than 2 µm, by particular preference more than 1 µm, relative to a main plane of this visible surface. This main plane can be, for example, the mid-plane of the layer surface, especially a mid-plane of the layer surface of which the mean distance squared (measured perpendicular to the mid-plane) from the layer surface is minimal.

The first layer (A) and the second layer (B) of the UV protective film of the component according to the invention can be combined by co-extrusion or by connecting separately prefabricated films, for example, by coating or lamination. In a preferred embodiment of the invention, the first and the second layer are embodied as co-extruded.

In order to manufacture a film by extrusion, the synthetic-material granulate, for example, the polycarbonate granulate is supplied to a filling hopper of an extruder and passes through the latter into the plastification system comprising screw and cylinder. The conveying and melting of the synthetic material takes place within the plastification system. The synthetic-material melt is pressed through a broad-slot nozzle. A filter device, a melt pump, stationary mixing elements and other components can be arranged between the plastification system and the broad-slot nozzle. The melt leaving the nozzle passes on to a smoothing calender. A smooth and/or glossy surface is preferably manufactured with polished metal rollers. A rubber roller can be used for structuring the film surface of the second layer on one side. The final forming takes place in the roller gap of the smoothing calender. The rubber rollers used by preference for the structuring of the film surface are described in U.S. Pat. No. 4,368,240. A smooth and/or glossy surface is preferably manufactured with polished metal rollers. The form fixing finally takes place through cooling and, in fact, alternately on the smoothing rollers and in the ambient air. The further devices of the plastification system serve for the transport, the possibly desired application of protective films and the winding on of the extruded films.

The UV protective film preferably comprises a layer thickness of ≥35 µm and ≤1000 µm, by particular preference ≥90 and ≤600 µm and by quite particular preference ≥100 µm and 400 µm.

In ease of doubt, a layer or a composite of layers which do/does not bear its/their own weight, that is, which is/are not constituted as self-supporting, and is/are especially flexible, should be regarded as a film.

Alternatively, a UV protective layer, for example, with a thickness of up to 10 mm, which possibly no longer comprises the character of a film, can also be used within the scope of the invention. However, a UV protective layer with the character of a film is particularly suitable because of the flexibility.

Furthermore, the UV protective film is preferably applied to an already prefabricated, functional component and attached to the component. In particular, it is therefore not necessary to fit all components of a manufacturing batch with a UV protective film. On the contrary, in an application-specific manner, only selected components can be provided with a UV protective film.

In a preferred embodiment of the invention, the component according to the invention comprises a substrate on which the organic layer can be arranged. In this context, the UV protective film can be arranged on the side of the substrate facing away from the organic layer, on the same side on which the organic layer is applied or also on both sides. The UV protective film is preferably connected to the substrate. The first layer (A) of the UV protective film also preferably faces away from the substrate, and the second layer (B) faces towards the substrate.

In particular, the substrate can be constituted in such a manner that the organic layer and optionally electrodes for electrical contacting and/or further elements of the component are attached to it.

The substrate expediently mechanically stabilises the active organic layer. In view of the generally high mechanical stability of the substrate by comparison with the film, the UV protective film can be attached stably and preferably permanently to the substrate in a particularly simple manner.

The substrate is expediently constituted as self-supporting.

Alternatively, the substrate can be constituted as flexible. For example, a film, in particular, a synthetic-material film, for example, a PMMA film is suitable for a flexible embodiment. The mechanical stability of the substrate/UV protective film composite can be increased by the UV protective film by comparison with a flexible substrate which is not provided with a UV protective film.

The substrate can be a transparent substrate. However, the substrate can also be a non-transparent substrate.

For example, the substrate can comprise glass, quartz, metal, metal foils, foils made of synthetic material, semiconductor wafers, such as silicon wafers or a germanium wafer or wafers based on phosphorus and/or nitrogen-containing semiconductor materials or an arbitrary other suitable substrate material.

In a preferred embodiment of the component according to the invention, the substrate is permeable for a radiation generated in the active layer, that is, in particular, formed from a radiation-permeable material. The side of the substrate facing away from the active layer can therefore form a radiation-emission surface of the component. For example, the substrate contains a glass. Especially in the case of OLEDs, a glass substrate is frequently used.

Furthermore, the substrate can be constituted as electrically insulating. In this case, the electrical contacting of the component is preferably implemented on the side of the substrate facing away from the UV protective film.

Furthermore, the substrate can be provided with the UV protective film substantially over its full area. By preference, the UV protective film completely covers at least the active organic layer.

In a preferred embodiment of the component according to the invention, the substrate is formed from a brittle material, and the UV protective film is constituted in a mechanically stable manner and connected to the substrate in such a manner that a splintered substrate is held together by means of the UV protective film.

For this purpose, the UV protective film is constituted with a suitable mechanical stability and preferably permanently connected to the substrate.

The overall stability of the composite of substrate and film, and therefore that of the entire component, can thus be advantageously increased via the UV protective film. Furthermore, the risk of injuries caused by splinters in the handling of the component is reduced.

Visible light is preferably generated by means of the active organic layer. The active organic layer can contain a single organic layer or a layer stack with a plurality of organic layers. The organic layer or respectively the organic layers preferably contain a semiconducting organic material.

For example, the organic layer contains a semiconducting polymer. Suitable organic or organo-metallic polymers comprise: Polyfluorenes, polythiopenes, polyphenylenes, poly-thiophene vinylenes, poly-p-phenylene vinylenes, polyspiro polymers and their families, copolymers, derivatives and mixtures thereof. These polymers can be deposited especially by means of wet-chemical methods, such as spin coating.

Alternatively or in addition to polymer materials, the organic layer can contain a low molecular-weight material (so-called small-molecules). Appropriate materials with low molecular-weight (small-molecule materials) are for example tris-8-aluminiun-quinolinol complexes and coumarins.

The component can also optionally comprise a plurality of preferably structured, mutually separate organic layers or layer stacks. The different layers or respectively layer stacks can be constituted to generate differently coloured light, for example, red, green or respectively blue light.

For the charge-carrier injection into the active organic layer, the latter can be connected in an electrically conducting manner to a first electrode and a second electrode. Via these electrodes, charge carriers—electrons or respectively holes—can be supplied to the organic layer for the generation of radiation through recombination within the organic layer. The electrodes are preferably constituted in layers, wherein the organic layer is arranged by particular preference between the electrodes.

The first electrode can be, for example, an anode and is preferably formed from indium-doped tin oxide (ITO), fluorine-tin-oxide (FTO), aluminium-zinc-oxide (AZO) or antimony-zinc-oxide (ATO). The first electrode can be an anode or a cathode. The first electrode can comprise hole-injecting or electron-injecting functions. The first electrode can be at least partially transparent for the radiation generated in the active organic layer, preferably, the first electrode is constituted as transparent. The first electrode can be applied by means of sputtering or by means of thermal evaporation. The first electrode can comprise a layer thickness within a range from approximately 5 nm to approximately 300 nm, preferably from approximately 100 nm to approximately 200 nm.

The second electrode can be formed by applying a metallic layer with a layer thickness from approximately 5 nm to approximately 1000 nm, preferably from approximately 100 nm to approximately 300 nm. The metallic layer can comprise at least one of the following metals: aluminium, barium, indium, silver, copper, gold, magnesium, samarium, platinum, palladium, calcium and lithium and combinations of the same or of this metal or a combination of this metal or several of these metals, for example, an alloy.

The second electrode comprising the metallic layer is a cathode, for example, if the first electrode is an anode.

The second electrode can be optionally constituted as a multi-layered structure. By preference, one of the layers is constituted for the charge-carrier injection into the organic layer, and another layer of the second electrode is constituted as a reflector layer. The layer for the charge-carrier injection is expediently arranged between the reflector layer and the organic layer. The reflector layer and/or the charge-carrier injection layer can contain or consist of the metals listed above, wherein both layers expediently contain different metals.

The component according to the invention can also comprise an encapsulation for the organic layer. Such an encapsulation encapsulates the organic layer against harmful external influences, such as moisture. Such encapsulations are described, for example, in DE 10 2011079 160 A1. The encapsulation can be constituted, for example, as a roof construction. In one preferred embodiment, the encapsulation is constituted as transparent.

A control circuit of the component can be arranged on the substrate—optionally inside the encapsulation.

The component according to the invention can be constituted as a "top-emitter", as a "bottom-emitter" or transparent on both sides.

In general, it is the case that, in the case of as "top-emitter" or a "bottom-emitter", one electrode of the radiation-emitting device can be constituted as transparent according to various embodiments, and the other electrode can be constituted as reflecting. Alternatively to this, both electrodes can also be constituted as transparent.

The term "bottom-emitter", as used here, designates an embodiment which is constituted as transparent towards the substrate side of the component. For this purpose, for example, at least the substrate and the first electrode can be constituted as transparent. In this embodiment, the first electrode is preferably arranged directly on the substrate. The second electrode is preferably arranged on the side of the active organic layer facing away from the substrate. A component constituted as "bottom-emitter" can accordingly emit radiation generated, for example, in the active organic layers, on the substrate side of the component.

The term "top-emitter", as used here, designates, for example, an embodiment in which the second electrode is preferably arranged directly on the substrate. The second electrode is preferably constituted as transparent and arranged on the side of the active organic layer facing away from the substrate. A component constituted as "top-emitter" can accordingly emit radiation generated, for example, in the active organic layer, on the side of the first electrode of the component.

A combination of "bottom-emitter" and "top-emitter" transparent on both sides is also provided. With such an embodiment, the component is generally capable of emitting the light generated in the organic functional layers in both directions—that is, both towards the substrate side and also towards the side of the second electrode.

This embodiment of the component according to the invention accordingly comprises two radiation-output sides. The UV protective film can be arranged on one of the two radiation-output sides, but also on both radiation-output sides.

In a preferred embodiment of the component according to the invention, the second layer (B) of the UV protective film is matched to the component with regard to refractive index.

The radiation transfer of radiation front the component into the second layer (B) of the UV protective film is therefore facilitated, and the reflection losses at the interface(s) between component and UV protective film are minimised. For the refractive-index matching, the refractive index of the material of the second layer (B) preferably deviates by 8% or less from the refractive index of the material arranged at the side of the component, especially the refractive index of the substrate.

For the refractive-index matching, a correspondingly appropriate material can be used for the second layer (B). For the refractive-index matching to a glass substrate, for example, a polycarbonate is particularly appropriate for the second layer (B).

Alternatively or additionally, a refractive-index matching material, for example, an optical gel, can be used for the refractive-index matching, which is arranged between the second layer (B) of the UV protective film and the substrate. By preference, the refractive-index matching material minimises the abrupt change in refractive index from the substrate to the second layer (B) of the UV protective film.

In a further advantageous embodiment, the UV protective film is attached to the component. By preference, the UV protective film is attached to the component, especially to the substrate, by means of an adhesive agent, or the UV protective film is laminated onto the component, especially the substrate. For example, a pressure-sensitive adhesive, such as the Optically Clear Adhesive OCA 8212 manufactured by 3M is suitable as an adhesive agent.

If an adhesive agent is used, this can advantageously serve at the same time as a refractive-index matching material. Accordingly, the adhesive agent preferably comprises a refractive index which is disposed no more than 10%, preferably no more than 8% outside an interval limited by the refractive indices of the substrate and of the material of the second layer (B) of the UV protective film. By preference, the refractive-index matching material comprises a refractive index which is disposed between that of the substrate and the material of the second layer (B) of the UV protective film.

In a further preferred embodiment, an anti-statically active element is connected to the component, especially on the side of the radiation-output side. Deposits of dirt on the component can be reduced as a result. Constituting the UV protective film as antistatic has proved particularly advantageous. Electrostatically caused deposits on the film, which can have a disadvantageous influence on the output-side radiation power distribution, are reduced in this manner. An antistatic agent can be advantageously integrated within the UV protective film.

The antistatic agent can thus be integrated in the first layer A) and/or the second layer B) and/or in the coating of the UV protective film applied to the first layer A).

Alternatively, the antistatically active element can be provided as a separate antistatic film in a film composite especially co-extruded together with the UV protective film.

A further subject matter of the invention is the use of the component according to the invention as an organic radiation-emitting component, especially as an organic light emitting diode (OLED). Here, the active layer is expediently formed by means of an organic layer, which contains an organic (semi-)conducting material. The organic layer, here, contains, for example, at least one (semi-)conducting polymer and/or comprises at least one layer with a (semi-)conducting molecule, especially a low-molecular-weight molecule.

A prefabricated OLED can comprise especially electrodes for the electrical contacting and, alternatively or additionally, an encapsulation protecting the organic layer, which protects the organic layer, for example, from moisture.

A further subject matter of the invention is the use of the component according to the invention for lighting, especially for general lighting. The component can be used, for example, for indoor lighting, for outdoor lighting or in illuminated signs.

Further features, advantages and expediency of the invention are specified in the following description of the exemplary embodiments in conjunction with the FIGS.

Identical, similar and similarly operating elements are provided with the same reference numbers in the FIGS.

FIGS. 1a and 1b show an exemplary embodiment of a radiation-emitting component according to the invention with reference to a simplified schematic cross-sectional view of a "top-emitter" and will be explained in greater detail in the following.

Figure 1A:
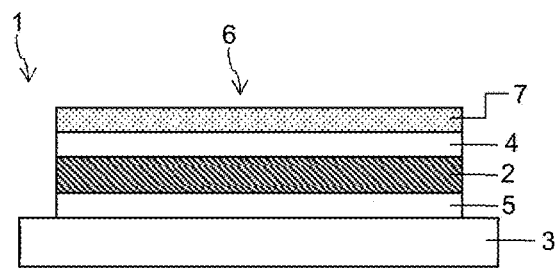
FIGS. 1a and 1b show an exemplary embodiment of a radiation-emitting component according to the invention with reference to a simplified schematic cross-sectional view of a "top-emitter".
Figure 1B:
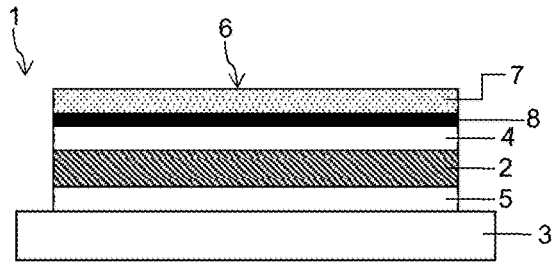

The radiation emitting component 1 in FIGS. 1a and 1b is constituted in each case as an OLED. The component 1 comprises an active organic layer 2 embodied to generate radiation. The organic layer 2 is arranged on a substrate 3 of the radiation-emitting component and connected to the latter.

For the charge-carrier injection into the active organic layer 2, the latter can be connected in an electrically conducting manner to a first transparent electrode 4 and a second reflecting electrode 5. Via these electrodes 4, 5, charge carriers—electrons or respectively holes—can be supplied to the organic layer for the generation of radiation through recombination within the organic layer 2. The electrodes 4 and 5 are constituted as layers, and the organic layer is arranged between the electrodes. The electrodes and the organic layer 2 are applied to the substrate 3. By preference, the second electrode 5 is constituted as a reflecting electrode and accordingly at the same time as a reflecting layer. For this purpose, the electrode 5 is preferably constituted to be metallic or alloy based, typically as an aluminium or silver alloy. A separate reflecting layer is not shown explicitly in the FIGS. The second electrode 5 is preferably arranged between the substrate 3 and the organic layer 2. To allow the passage of radiation, the first electrode 4 is expediently constituted to be radiation permeable. For this purpose, the electrode contains, for example, an indium tin oxide (ITO Indium Tin Oxide).

In the case of "top-emitter", the substrate 3 can be constituted to be radiation permeable or radiation impermeable. The substrate 3 can be manufactured from glass, for example, from Borofloat glass, a metallic film or a metal sheet, for example, made of aluminium or copper, or a polymer material, such as polyethylene terephthalate (PET).

Light passing through the side of the component 1 disposed opposite to the substrate can be output from the component 1, the latter is therefore designated as the radiation-output side 6.

A UV protective film 7 is attached on the radiation-output side 6 of the component 1.

For reasons of visual clarity, the presentation of an encapsulation for the organic layer 2 and the electrodes 4 and 5, which is preferably applied between the UV protective film 7 and the first electrode 4, has not been provided.

An explicit presentation of the electrical contacting of the component has also not been provided. A control circuit of the component can therefore be arranged on the substrate, for example,—optionally inside the encapsulation.

In the exemplary embodiment according to FIG. 1a, the UV protective film 7 is laminated onto the encapsulation disposed over the first electrode 4 and optionally also directly onto the substrate, whereas, in the exemplary embodiment according to FIG. 1b, a separate adhesive-agent layer 8, for example, a glue layer through which the UV protective film 7 is attached, is provided. An Optically Clear Adhesive OCA 8212 manufactured by 3M is used as the adhesive agent 8.

To facilitate the radiation transfer from the component into the UV protective film 7, the material of the second layer (B) of the UV protective film is matched in refractive index to the material of the encapsulation, which is disposed over the first electrode 4. For the second layer (B), a polycarbonate with a refractive index of approximately 1.59 is used. This material is well matched in refractive index for the case that the uppermost layer of the encapsulation represents a protective varnish based on epoxide systems with a refractive index of approximately 1.55 to 1.63.

Figure 2A:
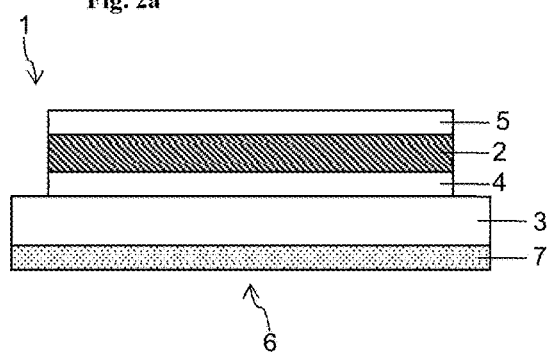
FIGS. 2a and 2b show a further exemplary embodiment of a radiation-emitting component according to the invention with reference to a simplified schematic cross-sectional view of a "bottom-emitter".
Figure 2B:
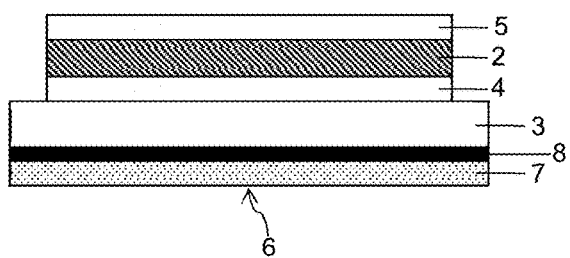

FIGS. 2a and 2b each show an exemplary embodiment of a radiation-emitting component according to the invention with reference to a simplified schematic cross-sectional view of a "bottom-emitter".

The radiation emitting component 1 in FIGS. 2a and 2b is constituted in each case as an OLED. The component 1 comprises an active organic layer 2 embodied to generate radiation. The organic layer 2 is arranged on a substrate 3 of the radiation-emitting component and connected to the latter.

For the charge-carrier injection into the active organic layer 2, the latter can be connected in an electrically conducting manner to a first transparent electrode 4 and a second reflecting electrode 5. Via these electrodes 4 and 5, charge carriers—electrons or respectively holes—can be supplied to the organic layer for the generation of radiation through recombination within the organic layer 2. The electrodes 4 and 5 are constituted as layers, and the organic layer is arranged between the electrodes. The electrodes and the organic layer 2 are applied to the substrate 3. By preference, the second electrode 5 is constituted as a reflecting electrode and accordingly at the same time as a reflecting layer. For this purpose, the electrode 5 is preferably constituted to be metallic or as an aluminium or silver alloy. A separate reflecting layer is not shown explicitly in the FIGS. The first electrode 4 is preferably arranged between the substrate 4 and the organic layer 2. To allow the passage of radiation, the first electrode 4 is expediently constituted to be radiation permeable. For this purpose, the electrode contains, for example, an indium tin oxide (ITO Indium Tin Oxide).

The substrate 3 is constituted to be radiation permeable for the radiation generated in the organic layer 2. Visible light is generated by means of the active organic layer 2. For example, a glass substrate made of Borofloat glass can be used as the radiation-permeable substrate.

Light passing through the face of the substrate 3 facing away from to the organic layer 2 can be output from the component 1, the latter is therefore designated as the radiation-output side 6. A UV protective film 7 is attached on the radiation output side 6 of the component 1. The latter is connected to the substrate 3.

For reasons of visual clarity, the presentation of an encapsulation for the organic layer 2, which is preferably arranged on the side of the substrate 4 facing away from the UV protective film 7, has not been provided.

An explicit presentation of the electrical contacting of the component has also not been provided. A control circuit of the component can therefore be arranged on the substrate, for example,—optionally inside the encapsulation.

In the exemplary embodiment according to FIG. 2a, the UV protective film 7 is laminated onto the substrate 3, whereas, in the exemplary embodiment according to FIG. 2b, a separate adhesive-agent layer 8, for example, a glue layer through which the UV protective film 7 is attached, is provided. An Optically Clear Adhesive OCA 8212 manufactured by 3M is used as the adhesive agent 8.

To facilitate the radiation transfer from the substrate 4 into the UV protective film 7, the material of the second layer (B)

of the UV protective film is matched in refractive index. For the second layer (B), a polycarbonate with a refractive index of approximately 1.59 is used. This material is well matched in refractive index to a glass substrate, especially a Borofloat glass substrate with a refractive index of approximately 1.54.

Figure 3A:
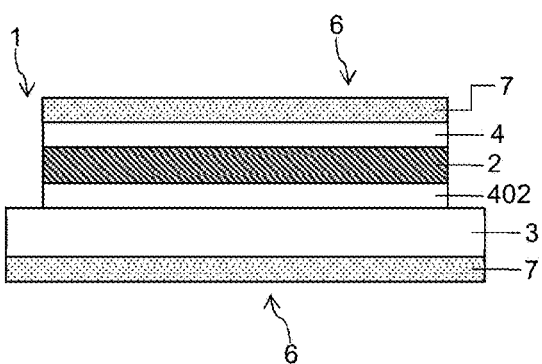
FIGS. 3a and 3b show a further exemplary embodiment of a radiation-emitting component according to the invention with reference to a simplified schematic cross-sectional view of a component transparent on both sides.
Figure 3B:
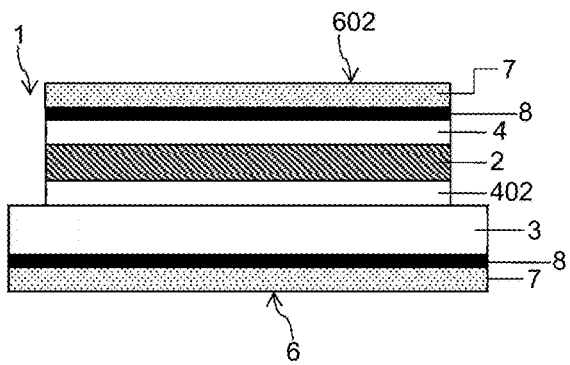

FIGS. 3a and 3b each show an exemplary embodiment of a radiation-emitting component according to the invention with reference to a simplified schematic cross-sectional view of an emitter transparent on both sides.

The radiation emitting component 1 is constituted in each case as an OLED. The component 1 comprises an active organic layer 2 embodied to generate radiation. The organic layer 2 is arranged on a substrate 3 of the radiation emitting component and connected to the latter.

For the charge-carrier injection into the active organic layer 2, the latter can be connected in an electrically conducting manner to a first transparent electrode 4 and a further transparent: electrode 402. Via these electrodes 4, 402, charge carriers—electrons or respectively holes—can be supplied to the organic layer for the generation of radiation through recombination within the organic layer 2. The electrodes 4 and 402 are constituted as layers, and the organic layer is arranged between the electrodes. The electrodes and the organic layer 2 are applied to the substrate 3. By preference one of the transparent electrodes 4 or 402 is constituted as a thin metallic film, especially made of silver. The other transparent electrode 4 or 402 preferably contains an indium tin oxide (ITO Indium Tin Oxide).

The substrate 3 is constituted to b radiation permeable for the radiation generated in the organic layer 2. Visible light is generated by means of the active organic layer 2. A glass substrate made of Borofloat glass is used as the radiation permeable substrate.

Light passing through the face of the substrate 3 facing away from to the organic layer 2 and through the side of the component disposed opposite to the substrate can be output from the component 1, these two sides are therefore designated as the radiation-output sides 6 and 602.

According to FIGS. 3a and 3b, UV protective films 7 are attached on both radiation-output sides 6 and 602 of the component 1. Alternatively, a UV protective film 7 can be attached only on one of the two radiation-output sides.

For reasons of visual clarity, the presentation of an encapsulation for the organic layer 2 and the electrodes 4 and 402, which is preferably applied between the UV protective film 7 and the one electrode 4, has not been provided.

An explicit presentation of the electrical contacting of the component has also not been provided. A control circuit of the component can therefore be arranged on the substrate, for example,—optionally inside the encapsulation.

In the exemplary embodiment according to FIG. 3a, the UV protective film 7 is laminated onto the encapsulation disposed over the one electrode 4 and optionally also directly onto the substrate, whereas, in the exemplary embodiment according to FIG. 3b, a separate adhesive-agent layer 8, for example, a glue layer through which the UV protective film 7 is attached, is provided. An Optically Clear Adhesive OCA 8212 manufactured by 3M is used as the adhesive agent 8.

To facilitate the radiation transfer from the substrate 3 into the UV protective film 7 on the radiation output side 6, the material of the second layer (B) of the UV protective film is matched in refractive index to the substrate. For the second layer (B), a polycarbonate with a refractive index of approximately 1.59 is used. This material is well matched in refractive index to a glass substrate, especially a Borofloat glass substrate with a refractive index of approximately 1.54. A glass cover or an encapsulation with a protective varnish based on an epoxide system is preferably disposed on the radiation output side 602 as the uppermost layer. To facilitate the radiation transfer from the component, also on this radiation-output side 602, into the UV protective film 7, the material of the second layer (B) of the UV protective film is matched in refractive index to glass or the epoxide system. For the second layer (B), a polycarbonate with a refractive index of approximately 1.59 is used. This material is well matched in refractive index to the epoxide systems with a refractive index of approximately 1.55 to 1.63 or to the glass cover which behaves in a similar manner to the substrate glass.

In the following, films and their manufacture, which are particularly well-suited for a component according to the invention, especially a component emitting visible light, are described by way of example.

Materials Used:

Makrolon 3108 550115:

High viscosity Bisphenol A Polycarbonate with an MVR of 6.0 cm$^3$/10 min (according to ISO 1133 at 300° C. and 1.2 kg)

Makrolon 2600 000000:

Medium-viscosity high-viscosity Bisphenol A Polycarbonate with an MVR of 12.5 cm$^3$/10 min (according to ISO 1133 at 300° C. and 1.2 kg)

Tinuvin 1600:

UV-protective agent manufactured by BASF, Ludwigshafen (formerly Ciba Specialty Chemicals) (biphenyl substituted triazine of the formula I with X=OCH$_2$CH (CH$_2$CH$_3$)C$_4$H$_9$)

Tinuvin 360 (2,2'-methylene-bis(6-(2H-benzotriazole-2-yl)-4-(1,1,3,3-tetramethylbutyl))-phenol):

Low volatility commercial UV protective agent manufactured by BASF, Ludwigshafen, from the group of hydroxyphenyl benzotriazoles.

Plexiglas 8N:

PMMA with an MVR of 3 cm$^3$/10 min (according to ISO 1133 at 230° C. and 3.8 kg) and a weight-average molecular weight M$_w$ of 124 kg/mol (determined by gel permeation chromatography in tetrahydrofurane at 23° C.; calibration to polystyrene standards of Röhm GmbH & Co. KG).

Example 1

Manufacture of the Tinuvin 1600-UV-Protective-Compounds:

The manufacture of the Tinuvin 1600 UV protective compounds (granulate) was implemented with conventional twin-screw compound extruder with processing temperatures from 230 to 285° C. conventional for polymethylmethacrylate.

A master batch was prepared with the following composition:

Plexiglas 8N manufactured by Evonik with a content of 95% by weight.

Tinuvin 1600 as a colourless powder with a content of 5% by weight.

15 kg of powder compound consisting of 10 kg Plexiglas 8N-oversize (mean particle diameter approximately 0.8 mm) and 5 kg Tinuvin 1600, equivalent to 5% by weight) were added to 85 kg Plexiglas 8N in a twin-screw extruder (ZSK 32) with a rotational speed of 190 min$^{-1}$ and a throughput of 50 kg/h. The mass temperature was 278° C. and the granulate obtained was clear and transparent.

Example 2

Manufacture of the Compounds Containing Tinuvin® 360 as UV Absorber:

The manufacture of the compound (granulate) containing Tinuvin® 360 as UV absorber was implemented with a conventional twin-screw compounding extruder with processing temperatures from 275 to 300° C. conventional for polycarbonates.

A master batch was prepared with the following composition:

95% by weight polycarbonate Makrolon® 3108 550115 manufactured by Bayer MaterialScience AG 5% by weight Tinuvin® 360 as colourless powder 10 kg of powder compound consisting of 5 kg Makrolan® 3108-oversize (obtained by milling from the granulate) (mean particle diameter approximately 0.8 mm, measured according to ISO 13320-1 (laser diffraction method)) and 5 kg Tinuvin 360, equivalent to 5% by weight) were added to 90 kg Makrolon® in a twin-screw extruder (ZSK 32) with a rotational speed of 175 $min^{-1}$ and a throughput of 50 kg/h. The mass temperature was 306° C. and the granulate obtained was clear and transparent.

Manufacture of a Co-Extruded UV Protective Film:
Film Co-Extrusion:
The plant used comprises
an extruder with a screw of 105 mm diameter (D) and a length of 41×D. The screw comprises a degassing zone;
a co-extruder for the application of a cover layer with a screw of length 41 D and a diameter of 35 mm to a deflection head
a special co-extrusion broad-slot nozzle with 1500 mm width;
a triple-roller smoothing calender with horizontal roller arrangement, wherein the third roller can be pivoted by +/−45° relative to the horizontal;
a roller track;
a device for two-sided application of protective film;
an extractor device;
a winding station.

The granulate of the base material was supplied to the filling hopper of the main extruder. The melting and conveying of the respective material was implemented in each case in the plastification system cylinder/screw. Both material melts were combined in the co-extrusion nozzle. From the nozzle, the melt passes to the smoothing calender, of which the rollers comprise the temperature named in Table 1. The final forming and cooling of the material takes place on the smoothing calender. For the smoothing of the surfaces, polished chromium rollers were used. Following this, the film is transported through an extractor, the protective film is applied on both sides, after this, the winding of the film is implemented.

The following process parameters were selected:

TABLE 1

| | |
|---|---|
| Temperature of the main extruder | 295° C. +/− 5° C. |
| Temperature of the co-extruder | 270° C. +/− −5° C. |
| Temperature of the deflection head | 285° C. +/− −5° C. |
| Temperature of the nozzle | 300° C. +/− −5° C. |
| Rotational speed of the main extruder | 60 $min^{-1}$ |
| Rotational speed of the co-extruder | 31 $min^{-1}$ |
| Temperature of roller 1 | 76° C. |

TABLE 1-continued

| | |
|---|---|
| Temperature of roller 2 | 73° C. |
| Temperature of roller 3 | 140° C. |
| Pull-off rate | 14.6 m/min |

Example 3

Main Extruder:
A compound with the following composition was mixed:
Tinuvin 360-UV-protection-master batch from Example 2 and polycarbonate Makrolon 3108 550115 manufactured by Bayer MaterialScience AG with a content as shown in column 2 "main extruder" in Table 2.

Co-Extruder:
A compound with the following composition was mixed:
100% by weight Tintivin 1600 UV protection master batch from Example 1

From this, a film was extruded with smooth sides on both sides on the transparent polycarbonate layer and the transparent PMMA layer and a total layer thickness of 250 µm.

The thickness of the transparent coating obtained in this manner was determined by means of an Eta SD 30 manufactured by Eta Optik GmbH.

Example 4

Main Extruder:
For the main layer, the following material was used:
Polycarbonate Makrolon 3108 550115 manufactured by Bayer MaterialScience AG with a content as shown in column 2 "main extruder" in Table 2

Co-Extruder:
A compound with the following composition was mixed:
100% by weight Tinuvin 360 UV protection master batch from Example 2

From this, a film was extruded with smooth sides on both sides on the transparent polycarbonate layer and the transparent UV-protected polycarbonate layer and a total layer thickness of 250 µm.

TABLE 2

| | Main extruder | Co-extruder |
|---|---|---|
| Example 3 | 235 µm | 15 µm |
| | 6% Compound from Example 3 + 94% M. 3108 550115 | 100% Compound from Example 1 |
| Example 4 | 220 µm | 30 µm |
| | 100% M. 3108 550115 | 100% Compound from Example 3 |

Example 5

The OLED is a 47.5 mm×125 mm (exterior dimensions) large white-emitting "bottom" emitter according to exemplary embodiment 2b. The active lighting area is 39.4 $cm^2$. The component has an inorganic thin-layer encapsulation as diffusion barrier. The substrate carrying the thin-layer system was laminated onto a corresponding covering glass. The UV film was glued onto a part of the lighting area (approximately 8 $cm^2$).

For this purpose, the liner was removed from an adhesive agent (OCA 8212 manufactured by 3M), and the adhesive agent was placed onto the UV protective film. The side from which the liner was removed faced towards the second layer (B) of the UV protective film, which contained polycarbonate. The adhesive agent was laminated onto the UV protective film with a hand roller. A correspondingly large sample was cut out of the UV protective film, and the liner was removed on the side of the adhesive agent facing away from the UV protective film. The UV-protective-film-adhesive-agent composite was aligned with the exposed adhesive-agent side towards the OLED substrate, positioned and laminated onto the OLED with a hand roller.

The lighting picture of this OLED after 5 h ageing test under a xenon lamp (distance 0.5 m) was investigated.

Figure 4:
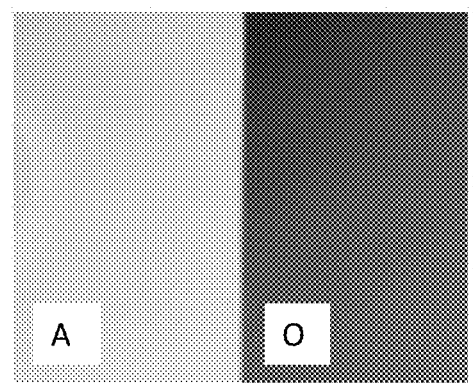
FIG. 4 shows the lighting picture of an OLED after 5h ageing.

FIG. 4 shows the lighting picture of an OLED after 5 h ageing test under a xenon lamp (distance 0.5 m). Left side provided with a UV protective film according to the invention as shown in Example 3 (A), and right side without film (O). The luminance of the OLED declines significantly in the unprotected region of the active face.

Figure 5:
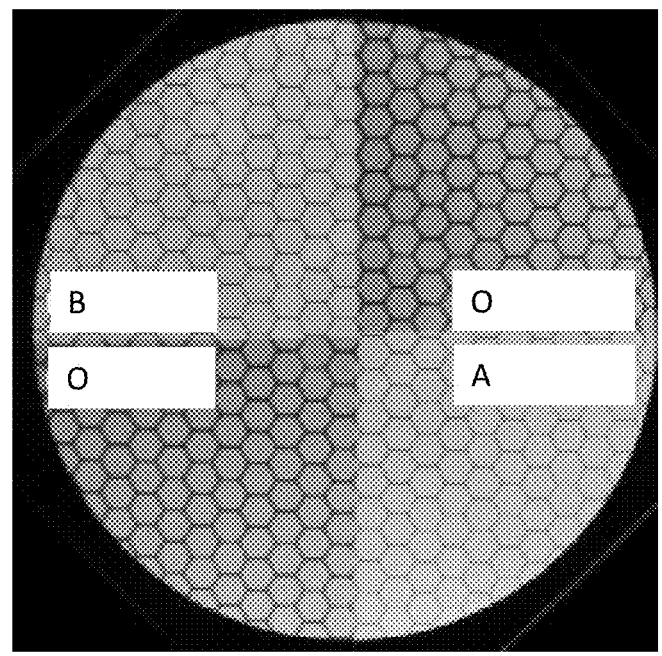
FIG. 5 shows the lighting fixture of an LED after 5 hours ageing test under a xenon lamp (distance 0.5 m).

FIG. 5 shows the lighting fixture of an LED after 5 hours ageing test under a xenon lamp (distance 0.5 m). The left upper side (B) is provided with a UV protective film according to Example 4 and the right upper side (O) carries no UV protective film. The right lower side is provided with a UV protective film according to the invention as shown in Example 3 (A) and the left lower side carries no UV protective film (O). The luminance of the OLED declines significantly in the unprotected region of the active face.

Further exemplary embodiments are structured analogously to any one of the previously named exemplary embodiments, wherein the UV protective film (7) is arranged relative to the active organic layer (2) in such a manner that its first layer (A) faces away from the active organic layer (2) and its second layer (B) faces towards the active organic layer (2). The first layer can here comprise a layer surface extending, on a side of the first layer facing away from the active organic layer (2), over the entire first layer, which is free from regularly arranged geometric structural elements. Alternatively or additionally, the first layer can comprise a layer surface extending on a side of the first layer facing away from the active organic layer over the entire first layer, which is free from projections on the layer surface and/or indentations in the layer surface with a height or respectively depth of more than 2 μm, by particular preference more than 1 μm.

Figure 6:
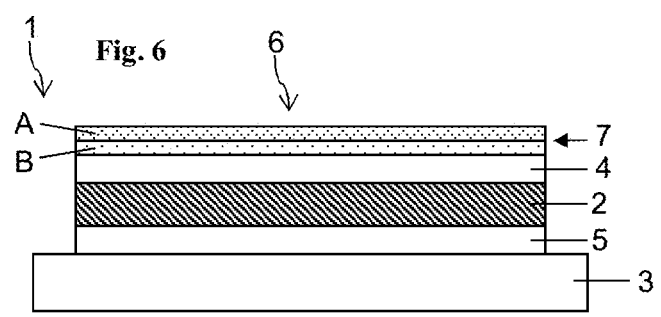
FIG. 6, shows an embodiment of the radiation emitting component according to the invention.

FIG. 6, in this respect, shows a further exemplary embodiment of the radiation emitting component according to the invention. This is structured in a similar manner to the exemplary embodiment of FIG. 1a, and comprises all of the features described previously with regard to FIG. 1.

The UV protective film (7) in the present exemplary embodiment is arranged relative to the active organic layer (2) in such a manner that its first layer (A) faces away from the active organic layer (2) and its second layer (B) faces towards the active organic layer. The first layer can here comprise a layer surface extending, on a side of the first layer facing away from the active organic layer (2), over the entire first layer, which is free from regularly arranged geometric structural elements. By preference, a layer surface of the first layer extending on a side facing away from the active layer over the entire first layer is free from projections on the layer surface and/or indentations in the layer surface with a height or respectively depth of more than 2 μm, by particular preference more than 1 μm.

Further exemplary embodiments are structured analogously to any one of the previously named exemplary embodiments, wherein a roughness of a surface of the first layer (A) facing away from the active organic layer (2) is smaller than or equal to 2 μm and/or a gloss level for an angle of 60° of a surface of the first layer facing away from the organic layer (2) is greater than or equal to 70 and/or the UV protective film is free from particles or substances with scattering properties and/or the UV protective film is free from regions with scattering properties.

The invention claimed is:

1. An organic radiation-emitting component comprising an active organic layer constituted to generate radiation and one or two radiation-output sides, wherein, on at least one radiation-output side of the component, a UV protective film is arranged and connected to the component, wherein the UV protective film contains at least one first layer (A) and a second layer (B), wherein the first layer (A) contains 1 to 7.5% by weight, with reference to the total weight of the first layer (A), of (6-[4,6-bis(4-phenylphenyl)-1H-1,3,5-triazin-2-ylidene)-3-(2-ethylhexoxy)cyclohexa-2,4-dien-1-one)-,
and wherein the second layer (B) contains polycarbonate, and wherein the first layer (A) comprises polymethacrylate and has a thickness of from ≥10 μm to ≤200 μm, wherein the UV protective film is arranged relative to the active organic layer (2) in such a manner that its first layer (A) faces away from the active organic layer (2) and its second layer (B) faces towards the active organic layer (2) and wherein a gloss level for an angle of 60° from a surface, determined according to EN ISO 2813, of the first layer facing away from the active organic layer (2) is greater than or equal to 70.

2. The component according to claim 1, wherein the UV protective film is free from particles or substances with scattering properties.

3. The component according to claim 1, wherein the UV protective film is free from regions with scattering properties for visible light.

4. The component according to claim 1, wherein the first layer comprises a layer surface extending, on a side of the first layer facing away from the active organic layer (2), over the entire first layer, which is free from regularly arranged geometric structural elements.

5. The component according to claim 1, wherein the first layer (A) and the second layer (B) are constituted as co-extruded.

6. The component according to claim 1, wherein the UV protective film (7) has a thickness of ≥35 μm and ≤1000 μm.

7. The component according to claim 1, wherein the first layer (A) of the UV protective film (7) comprises a coating.

8. The component according to claim 1, wherein the UV protective film (7) is attached to the component (1) by means of an adhesive agent (8), or the UV protective film is laminated onto the component.

9. A method comprising utilizing the component according to claim 1 as an organic light-emitting diode.

* * * * *